(12) United States Patent
Park et al.

(10) Patent No.: US 11,107,934 B2
(45) Date of Patent: Aug. 31, 2021

(54) COMPOSITION FOR FORMING SOLAR CELL ELECTRODE AND SOLAR CELL ELECTRODE PREPARED USING THE SAME

(71) Applicant: Changzhou Fusion New Material Co. Ltd, Changzhou (CN)

(72) Inventors: Sang Hee Park, Suwon-si (KR); Ji Seon Lee, Suwon-si (KR); Sung Bin Cho, Suwon-si (KR); Min Soo Park, Suwon-si (KR)

(73) Assignee: CHANGZHOU FUSION NEW MATERIAL CO. LTD, Changzhou (CN)

( * ) Notice: Subject to any disclaimer, the term of this patent is extended or adjusted under 35 U.S.C. 154(b) by 0 days.

(21) Appl. No.: 16/574,309

(22) Filed: Sep. 18, 2019

(65) Prior Publication Data
US 2020/0185549 A1    Jun. 11, 2020

(30) Foreign Application Priority Data

Dec. 5, 2018 (KR) .......................... 10-2018-0155552

(51) Int. Cl.
| | | |
|---|---|---|
| H01L 31/00 | (2006.01) |
| H01B 1/22 | (2006.01) |
| C09D 5/24 | (2006.01) |
| H01L 31/0224 | (2006.01) |
| C03C 8/18 | (2006.01) |
| C03C 4/14 | (2006.01) |

(52) U.S. Cl.
CPC ........ H01L 31/022425 (2013.01); C03C 4/14 (2013.01); C03C 8/18 (2013.01); C09D 5/24 (2013.01); H01B 1/22 (2013.01)

(58) Field of Classification Search
CPC ... H01B 1/00; H01B 1/16; H01B 1/22; C09D 5/24; H01L 31/0224
See application file for complete search history.

(56) References Cited

U.S. PATENT DOCUMENTS

| | | | | |
|---|---|---|---|---|
| 5,527,627 A | * | 6/1996 | Lautzenhiser | H01L 23/3735 257/E23.106 |
| 2009/0011201 A1 | * | 1/2009 | Ikeda | H05K 3/4061 428/206 |
| 2019/0080815 A1 | * | 3/2019 | Kamiga | H01B 1/22 |

FOREIGN PATENT DOCUMENTS

| | | |
|---|---|---|
| TW | 201814920 A | 4/2018 |
| WO | WO 2013105821 A1 * | 7/2013 |
| WO | WO 2017159762 A1 * | 9/2017 |

OTHER PUBLICATIONS

J. Kähler, N. Heuck, G. Palm, A. Stranz, A. Waag and E. Peiner, "Die-attach for high-temperature applications using fineplacer-pressure-sintering (FPS)," 3rd Electronics System Integration Technology Conference ESTC, Berlin, 2010, pp. 1-5, doi: 10.1109/ESTC.2010.5642808.*
Taiwanese Office action dated.

* cited by examiner

Primary Examiner — Mark Kopec
(74) Attorney, Agent, or Firm — Squire Patton Boggs (US) LLP

(57) ABSTRACT

A composition for solar cell electrodes, a solar cell electrode, and a method of manufacturing a solar cell, the composition including a conductive powder; a glass frit; and an organic vehicle, wherein the conductive powder includes a first silver powder having a cross-sectional particle porosity of about 0.1% to about 6%.

13 Claims, 1 Drawing Sheet

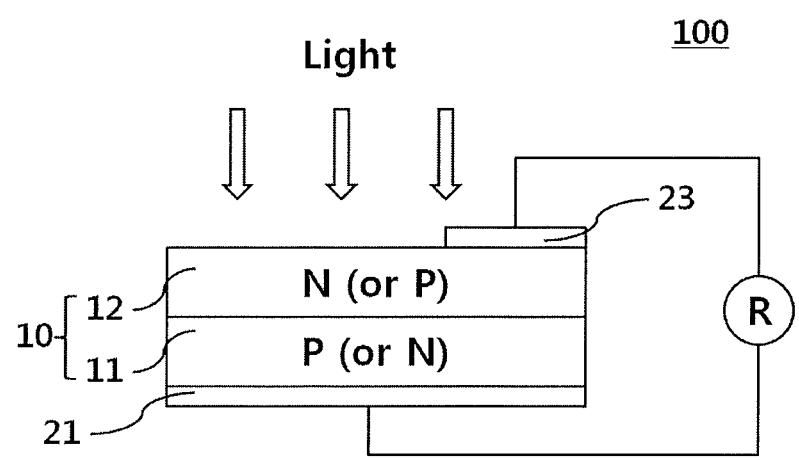

COMPOSITION FOR FORMING SOLAR CELL ELECTRODE AND SOLAR CELL ELECTRODE PREPARED USING THE SAME

CROSS-REFERENCE TO RELATED APPLICATION

Korean Patent Application No. 10-2018-0155552, filed on Dec. 5, 2018, in the Korean Intellectual Property Office, and entitled: "Composition for Forming Solar Cell Electrode and Solar Cell Electrode Prepared Using the Same," is incorporated by reference herein in its entirety.

BACKGROUND

1. Field

Embodiments relate to a composition for solar cell electrodes and a solar cell fabricated using the same.

2. Description of the Related Art

A silicon-based solar cell may include a substrate formed of a p-type silicon semiconductor and an emitter layer formed of an n-type silicon semiconductor. A p-n junction may be formed between the p-type substrate and the n-type emitter layer. When light (e.g., sunlight) is incident on the solar cell having this structure, by the photovoltaic effect, electrons may be generated as majority carriers in the emitter layer formed of the n-type silicon semiconductor and holes may be generated as majority carriers in the substrate formed of the p-type silicon semiconductor. The electrons and holes generated by the photovoltaic effect may move to front and rear electrodes on upper and lower sides of the emitter layer, respectively. When these electrodes are connected to one another by a wire, current may flow therebetween.

SUMMARY

The embodiments may be realized by providing a composition for solar cell electrodes, the composition including a conductive powder; a glass frit; and an organic vehicle, wherein the conductive powder includes a first silver powder having a cross-sectional particle porosity of about 0.1% to about 6%.

The first silver powder may have a cross-sectional particle porosity of about 0.1% to about 5%.

The first silver powder may have an average particle diameter of about 0.5 μm to about 3.5 μm.

The first silver powder may have an average pore size of about 10 nm to about 300 nm.

The conductive powder may further include a second silver powder that is different from the first silver powder.

The first silver powder may be present in an amount of about 30 wt % to about 95 wt %, and the second silver powder may be present in an amount of about 5 wt % to about 70 wt %, all wt % being based on a total weight of the conductive powder.

The composition may include about 60 wt % to about 95 wt % of the conductive powder; about 0.1 wt % to about 20 wt % of the glass frit; and about 1 wt % to about 30 wt % of the organic vehicle, all wt % being based on a total weight of the composition.

The solar cell electrode may be prepared by applying the composition for solar cell electrodes onto a substrate; and baking the substrate having the composition thereon.

The embodiments may be realized by providing a method of manufacturing a solar cell, the method including applying the composition for solar cell electrodes according to an embodiment onto a substrate; and baking the substrate having the composition thereon.

BRIEF DESCRIPTION OF THE DRAWING

Features will be apparent to those of skill in the art by describing in detail exemplary embodiments with reference to the attached drawing in which:

The FIGURE illustrates a schematic sectional view of a solar cell according to one embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "or" is not an exclusive term, e.g., "A or B" would include A, B, or A and B.

As used herein, the singular forms, "a," "an," and "the" are intended to include the plural forms as well, unless the context clearly indicates otherwise.

As used herein, the terms "comprises," "comprising," "includes," and/or "including," specify the presence of stated features, integers, steps, operations, elements, components, and/or groups thereof, but do not preclude the presence or addition of one or more other features, integers, steps, operations, elements, components, and/or groups thereof.

As used herein, although the terms "first", "second", "A", "B", etc. may be used herein to describe various elements, components, regions, layers and/or sections, these elements, components, regions, layers and/or sections should not be limited by these terms. These terms are only used to distinguish one element, component, region, layer or section from another element, component, region, layer or section.

As used herein, "X to Y", to represent a range of a certain value, means "greater than or equal to X and less than or equal to Y" or "≥X and ≤Y".

An embodiment may provide a composition for solar cell electrodes. The composition may include, e.g., a conductive powder, a glass frit, and an organic vehicle. In an implementation, the conductive powder may include a first silver powder having a cross-sectional particle porosity of, e.g., about 0.1% to about 6%.

Now, each component of the composition for solar cell electrodes will be described in more detail.

Conductive Powder

The conductive powder may include the first silver powder having a cross-sectional particle porosity of, e.g., about 0.1% to about 6% (for example, about 0.1%, about 0.2%, about 0.3%, about 0.4%, about 0.5%, about 0.6%, about 0.7%, about 0.8%, about 0.9%, about 1%, about 1.1%, about 1.2%, about 1.3%, about 1.4%, about 1.5%, about 1.6%, about 1.7%, about 1.8%, about 1.9%, about 2%, about 2.1%, about 2.2%, about 2.3%, about 2.4%, about 2.5%, about 2.6%, about 2.7%, about 2.8%, about 2.9%, about 3%, about 3.1%, about 3.2%, about 3.3%, about 3.4%, about 3.5%, about 3.6%, about 3.7%, about 3.8%, about 3.9%, about 4%, about 4.1%, about 4.2%, about 4.3%, about 4.4%, about 4.5%, about 4.6%, about 4.7%, about 4.8%, about 4.9%, about 5%, about 5.1%, about 5.2%, about 5.3%, about 5.4%, about 5.5%, about 5.6%, about 5.7%, about 5.8%, about 5.9%, or about 6%). When the cross-sectional particle porosity of the first silver powder falls within this range, sintering of the conductive powder may be promoted due to an increase in specific surface area of the first silver powder and due to oxygen present in pores of the first silver powder, thereby allowing or facilitating formation of a dense conductive film. For example, series resistance of a front electrode may be reduced and conversion efficiency of a solar cell can be improved. In an implementation, the first silver powder may have a cross-sectional particle porosity of, e.g., about 0.1% to about 5%. In an implementation, the first silver powder may have a cross-sectional particle porosity of, e.g., greater than or equal to 0.1% and less than 5%.

The cross-sectional particle porosity may be calculated or determined by mixing the first silver powder with a resin, performing ion beam cross-section polishing (CP), obtaining an cross-sectional FE-SEM image, and measuring a cross-sectional area of particles, including pores thereof, and the cross-sectional area of just the pores through analysis of the image. For example, the calculation process may be performed on a total of 300 particles.

In an implementation, the first silver powder may have various particle shapes, e.g., a spherical particle shape, a flake particle shape, or an amorphous particle shape.

In an implementation, the first silver powder may have an average particle diameter ($D_{50}$) of, e.g., about 0.5 µm to about 3.5 µm (for example, about 0.5 µm, about 0.6 µm, about 0.7 about 0.8 µm, about 0.9 µm, about 1 µm, about 1.1 µm, about 1.2 µm, about 1.3 µm, about 1.4 µm, about 1.5 µm, about 1.6 µm, about 1.7 µm, about 1.8 µm, about 1.9 µm, about 2 µm, about 2.1 µm, about 2.2 µm, about 2.3 µm, about 2.4 µm, about 2.5 µm, about 2.6 µm, about 2.7 µm, about 2.8 µm, about 2.9 µm, about 3 µm, about 3.1 about 3.2 µm, about 3.3 µm, about 3.4 µm, or about 3.5 µm, for another example, about 0.9 µm to about 3.2 µm). Within this range, the composition may have good printability and low series resistance. Here, the average particle diameter ($D_{50}$) may be measured using a Model 1064LD particle size analyzer (CILAS Co., Ltd.) after dispersing the first silver powder in isopropyl alcohol (IPA) at 25° C. for 3 minutes via ultrasonication.

In an implementation, the first silver powder may have an average pore size of, e.g., about 10 nm to about 300 nm (for example, about 10 nm, about 20 nm, about 30 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 160 nm, about 170 nm, about 180 nm, about 190 nm, about 200 nm, about 210 nm, about 220 nm, about 230 nm, about 240 nm, about 250 nm, about 260 nm, about 270 nm, about 280 nm, about 290 nm, or about 300 nm, for another example, about 20 nm to about 250 nm). Within this range, the composition may have good printability and low series resistance. In an implementation, the average pore size may be measured by particle size analysis.

In an implementation, the conductive powder may further include another conductive powder, other than the first silver powder. In an implementation, the conductive powder may further include, e.g., a second silver (Ag) powder different from the first silver powder, gold (Au) powder, platinum (Pt) powder, palladium (Pd) powder, aluminum (Al) powder, or nickel (Ni) powder.

In an implementation, the conductive powder may further include the second silver (Al) powder. In an implementation, the second silver powder may have a cross-sectional particle porosity of, e.g., about 0% to less than about 0.1% (for example, about 0%, about 0.01%, about 0.02%, about 0.03%, about 0.04%, about 0.05%, about 0.06%, about 0.07%, about 0.08%, or about 0.09%, for another example, pore-free silver powder). In this case, a sintered density of the conductive powder may be improved, thereby allowing reduction in series resistance.

In an implementation, the second silver powder may have various particle shapes, e.g., a spherical particle shape, a flake particle shape, or an amorphous particle shape.

In an implementation, the second silver powder may have a nanometer or micrometer-scale particle size. In an implementation, the second silver powder may have, e.g., an average particle diameter of dozens to several hundred nanometers, or may have an average particle diameter of several to dozens of micrometers. In an implementation, the second silver powder may be a mixture of two or more types of silver powder having different particle sizes.

In an implementation, the second silver powder may have an average particle diameter ($D_{50}$) of, e.g., about 0.1 µm to about 10 µm (for example, about 0.1 µm, about 0.2 µm, about 0.3 µm, about 0.4 µm, about 0.5 µm, about 0.6 µm, about 0.7 µm, about 0.8 µm, about 0.9 µm, about 1 µm, about 1.1 µm, about 1.2 µm, about 1.3 µm, about 1.4 µm, about 1.5 µm, about 1.6 µm, about 1.7 µm, about 1.8 µm, about 1.9 µm, about 2 µm, about 2.1 µm, about 2.2 µm, about 2.3 µm, about 2.4 µm, about 2.5 µm, about 2.6 µm, about 2.7 µm, about 2.8 µm, about 2.9 µm, about 3 µm, about 3.1 µm, about 3.2 µm, about 3.3 µm, about 3.4 µm, about 3.5 µm, about 3.6 µm, about 3.7 µm, about 3.8 µm, about 3.9 µm, about 4 µm, about 4.1 µm, about 4.2 µm, about 4.3 µm, about 4.4 µm, about 4.5 µm, about 4.6 µm, about 4.7 µm, about 4.8 µm, about 4.9 µm, about 5 µm, about 5.1 µm, about 5.2 µm, about 5.3 µm, about 5.4 µm, about 5.5 µm, about 5.6 µm, about 5.7 µm, about 5.8 µm, about 5.9 µm, about 6 µm, about 6.1 µm, about 6.2 µm, about 6.3 µm, about 6.4 µm, about 6.5 µm, about 6.6 µm, about 6.7 µm, about 6.8 µm, about 6.9 µm, about 7 µm, about 7.1 µm, about 7.2 µm, about 7.3 µm, about 7.4 µm, about 7.5 µm, about 7.6 µm, about 7.7 µm, about 7.8 µm, about 7.9 µm, about 8 µm, about 8.1 µm, about 8.2 µm, about 8.3 µm, about 8.4 µm, about 8.5 µm, about 8.6 µm, about 8.7 µm, about 8.8 µm, about 8.9 µm, about 9 µm, about 9.1 µm, about 9.2 µm, about 9.3 µm, about 9.4 µm, about 9.5 µm, about 9.6 µm, about 9.7 µm, about 9.8 µm, about 9.9 µm, or about 10 µm, for another example, about 0.5 µm to about 5 µm). Within this range, the second silver powder may help provide reduction in series resistance and contact resistance. The average particle diameter ($D_{50}$) may be measured using a Model 1064LD particle size analyzer (CILAS Co., Ltd.) after dispersing the second silver powder in isopropyl alcohol (IPA) at 25° C. for 3 minutes via ultrasonication.

In an implementation, when the conductive powder further includes the second silver powder, the first silver powder may be present in an amount of, e.g., about 30 wt % to about 95 wt % (for example, about 30 wt %, about 31 wt %, about 32 wt %, about 33 wt %, about 34 wt %, about 35 wt %, about 36 wt %, about 37 wt %, about 38 wt %, about 39 wt %, about 40 wt %, about 41 wt %, about 42 wt %, about 43 wt %, about 44 wt %, about 45 wt %, about 46 wt %, about 47 wt %, about 48 wt %, about 49 wt %, about 50 wt %, about 51 wt %, about 52 wt %, about 53 wt %, about 54 wt %, about 55 wt %, about 56 wt %, about 57 wt %, about 58 wt %, about 59 wt %, about 60 wt %, about 61 wt %, about 62 wt %, about 63 wt %, about 64 wt %, about 65 wt %, about 66 wt %, about 67 wt %, about 68 wt %, about 69 wt %, about 70 wt %, about 71 wt %, about 72 wt %, about 73 wt %, about 74 wt %, about 75 wt %, about 76 wt %, about 77 wt %, about 78 wt %, about 79 wt %, about 80 wt %, about 81 wt %, about 82 wt %, about 83 wt %, about 84 wt %, about 85 wt %, about 86 wt %, about 87 wt %, about 88 wt %, about 89 wt %, about 90 wt %, about 91 wt %, about 92 wt %, about 93 wt %, about 94 wt %, or about 95 wt %), based on a total weight of the conductive powder. In an implementation, the second silver powder may be present in an amount of, e.g., about 5 wt % to about 70 wt % (for example, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt %, about 30 wt %, about 31 wt %, about 32 wt %, about 33 wt %, about 34 wt %, about 35 wt %, about 36 wt %, about 37 wt %, about 38 wt %, about 39 wt %, about 40 wt %, about 41 wt %, about 42 wt %, about 43 wt %, about 44 wt %, about 45 wt %, about 46 wt %, about 47 wt %, about 48 wt %, about 49 wt %, about 50 wt %, about 51 wt %, about 52 wt %, about 53 wt %, about 54 wt %, about 55 wt %, about 56 wt %, about 57 wt %, about 58 wt %, about 59 wt %, about 60 wt %, about 61 wt %, about 62 wt %, about 63 wt %, about 64 wt %, about 65 wt %, about 66 wt %, about 67 wt %, about 68 wt %, about 69 wt %, or about 70 wt %), based on the total weight of the conductive powder. Within this range, sintered density of the conductive powder may be improved, thereby facilitating a reduction in series resistance. In an implementation, the first silver powder may be present in an amount of, e.g., about 40 wt % to about 95 wt %, based on the total weight of the conductive powder, and the second silver powder may be present in an amount of, e.g., about 5 wt % to about 60 wt %, based on the total weight of the conductive powder.

In an implementation, the conductive powder may be present in an amount of, e.g., about 60 wt % to about 95 wt % (for example, about 60 wt %, about 61 wt %, about 62 wt %, about 63 wt %, about 64 wt %, about 65 wt %, about 66 wt %, about 67 wt %, about 68 wt %, about 69 wt %, about 70 wt %, about 71 wt %, about 72 wt %, about 73 wt %, about 74 wt %, about 75 wt %, about 76 wt %, about 77 wt %, about 78 wt %, about 79 wt %, about 80 wt %, about 81 wt %, about 82 wt %, about 83 wt %, about 84 wt %, about 85 wt %, about 86 wt %, about 87 wt %, about 88 wt %, about 89 wt %, about 90 wt %, about 91 wt %, about 92 wt %, about 93 wt %, about 94 wt %, or about 95 wt %), based on a total weight of the composition for solar cell electrodes. Within this range, the conductive powder may help improve solar cell conversion efficiency and may be easily prepared in paste form.

Glass Frit

The glass frit may serve to form crystal grains of the conductive powder in an emitter region by etching an anti-reflection layer and melting the conductive powder during a baking process of the composition for solar cell electrodes. The glass fit may help improve adhesion of the conductive powder to a wafer and may be softened to decrease the baking temperature during the baking process.

The glass frit may include a metal, e.g., lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), or aluminum (Al).

In an implementation, the glass fit may include, e.g., a Bi—Te—O glass frit, a Pb—Bi—O glass frit, a Pb—Te—O glass frit, a Pb—Te—Bi—O glass frit, a Te—B—O glass frit, a Te—Ag—O glass frit, a Pb—Si—O glass frit, a Bi—Si—O glass frit, a Te—Zn—O glass fit, a Bi—B—O glass frit, a Pb—B—O glass frit, a Bi—Mo—O glass frit, a Mo—B—O glass frit, or a Te—Si—O glass fit.

In an implementation, the glass fit may be, e.g., a Pb—Te—Bi—O glass frit. In an implementation, the Pb—Te—Bi—O glass frit may further include another metal, e.g., lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al) (for example, the group consisting of lithium (Li), silicon (Si), zinc (Zn), tungsten (W), magnesium (Mg), or manganese (Mn).

In an implementation, the glass frit may have, e.g., a spherical shape or an amorphous shape. In an implementation, the glass frit may have an average particle diameter ($D_{50}$) of, e.g., about 0.1 µm to about 10 µm (for example, about 0.1 µm, about 0.2 µm, about 0.3 µm, about 0.4 µm, about 0.5 µm, about 0.6 µm, about 0.7 µm, about 0.8 µm, about 0.9 µm, about 1 µm, about 2 µm, about 3 µm, about 4 µm, about 5 µm, about 6 µm, about 7 µm, about 8 µm, about 9 µm, or about 10 µm). The average particle diameter ($D_{50}$) may be measured using a Model 1064LD particle size analyzer (CILAS Co., Ltd.) after dispersing the glass frit in isopropyl alcohol (IPA) at 25° C. for 3 minutes via ultrasonication.

In an implementation, the glass frit may be present in an amount of, e.g., about 0.1 wt % to about 20 wt % (for example, about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, about 2 wt %, about 3 wt %, about 4 wt %, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt %, about 17 wt %, about 18 wt %, about 19 wt %, or about 20 wt %, for another example, about 0.5 wt % to about 5 wt %), based on the total weight of the composition for solar cell electrodes. Within this range, the glass frit may help reduce contact resistance.

The glass frit may be prepared from the aforementioned metals and/or oxides thereof by a suitable method. For example, the glass frit may be prepared by mixing the aforementioned metals and/or oxides thereof using a ball mill or a planetary mill, melting the mixture at 800° C. to 1,300° C., and quenching the melted mixture to 25° C., followed by pulverizing the obtained product using a disk mill, a planetary mill, or the like.

Organic Vehicle

The organic vehicle may impart suitable viscosity and rheological characteristics for printing to the composition for solar cell electrodes through mechanical mixing with inorganic components of the composition.

The organic vehicle may be a suitable organic vehicle used in a composition for solar cell electrodes and may include, e.g., a binder resin, a solvent, or the like.

In an implementation, the binder resin may include, e.g., an acrylate resin or a cellulose resin. In an implementation, ethyl cellulose may be used as the binder resin. In an implementation, the binder resin may include, e.g., ethyl hydroxyethyl cellulose, nitrocellulose, blends of ethyl cellulose and phenol resins, alkyd resins, phenol resins, acrylate ester resins, xylene resins, polybutene resins, polyester resins, urea resins, melamine resins, vinyl acetate resins, wood rosin, or polymethacrylates of alcohols.

In an implementation, the solvent may include, e.g., hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, ethyl lactate, or 2,2,4-trimethyl-1,3-pentanediol monoisobutyrate (Texanol). These may be used alone or as a mixture thereof.

In an implementation, the organic vehicle may be present in an amount of, e.g., about 1 wt % to about 30 wt % (for example, about 1 wt %, about 2 wt %, about 3 wt %, about 4 wt %, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt %, or about 30 wt %, for another example, about 3 wt % to about 15 wt %), based on the total weight of the composition for solar cell electrodes. Within this range, the organic vehicle may help provide sufficient adhesive strength and good printability to the composition.

Additive

In an implementation, the composition for solar cell electrodes may further include a suitable additive, e.g., to enhance flowability, processability and stability, as desired. In an implementation, the additive may include, e.g., a dispersant, a thixotropic agent, a plasticizer, a viscosity stabilizer, an anti-foaming agent, a pigment, a UV stabilizer, an antioxidant, a coupling agent, or the like. These may be used alone or as a mixture thereof. In an implementation, the additive may be present in an amount of, e.g., about 0.1 wt % to about 5 wt % (for example, about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, about 1.1 wt %, about 1.2 wt %, about 1.3 wt %, about 1.4 wt %, about 1.5 wt %, about 1.6 wt %, about 1.7 wt %, about 1.8 wt %, about 1.9 wt %, about 2 wt %, about 3 wt %, about 4 wt %, or about 5 wt %).

Solar Cell Electrode and Solar Cell Including the Same

Another embodiment may provide an electrode formed of or prepared from the composition for solar cell electrodes, and a solar cell including the same. The FIGURE illustrates a schematic view of a solar cell 100 according to an embodiment.

Referring to the FIGURE, a rear electrode 21 and a front electrode 23 may be formed by printing and baking a composition for solar cell electrodes (e.g., the composition for solar cell electrodes according to an embodiment) on a wafer or substrate 10 that includes a p-layer (or n-layer) 11 and an n-layer (or p-layer) 12, which may serve as an emitter. For example, a preliminary process for preparing the rear electrode may be performed by printing the composition on a back surface of the wafer and drying the printed composition at about 200° C. to about 400° C. for about 10 to about 60 seconds. Further, a preliminary process for preparing the front electrode may be performed by printing the composition (e.g., the composition for solar cell electrodes according to an embodiment) on a front surface of the wafer and drying the printed composition. Then, the front electrode and the rear electrode may be formed by baking the wafer at about 400° C. to about 950° C., e.g., at about 700° C. to about 950° C., for about 30 to about 210 seconds.

Next, the embodiments will be described in more detail with reference to Examples and Comparative Examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example

Details of components used in the Examples and Comparative Examples are as follows:

(A) Binder resin: Ethylcellulose (STD4, Dow Chemical Company)

(B) Solvent: Texanol (Eastman Chemical Co., Ltd.)

(C) First silver powder (C1) Spherical silver powder having a cross-sectional particle porosity of 5% and an average particle diameter of 1.9 μm (4-8F, Dowa Hightech Co. Ltd.)

(C2) Spherical silver powder having a cross-sectional particle porosity of 4% and an average particle diameter of 1.7 μm (3-8F, Dowa Hightech Co. Ltd.)

(C3) Spherical silver powder having a cross-sectional particle porosity of 3.7% and an average particle diameter of 2.9 μm (5-7F, Dowa Hightech Co. Ltd.)

(D) Second silver powder (D1) Spherical silver powder having a cross-sectional particle porosity of 0% and an average particle diameter of 1.8 μm (4-54F, Dowa Hightech Co. Ltd.)

(D2) Spherical silver powder having a cross-sectional particle porosity of 0% and an average particle diameter of 1.6 μm (3-72, Dowa Hightech Co. Ltd.)

(E) Glass frit: A Pb—Bi—Te—Zn—Li—O glass frit composed of lead oxide (28 mol %), bismuth oxide (17 mol %), tellurium oxide (45 mol %), zinc oxide (3 mol %), and lithium oxide (7 mol %) and having an average particle diameter of 1.0 μm and a glass transition temperature of 270° C.

(F) Dispersant: ED-120 (Kusumoto Chemical)

(G) Thixotropic agent: Thixatrol ST (Elementis Co., Ltd.)

Examples 1 to 5 and Comparative Examples 1 and 2

The aforementioned components were weighed in amounts listed in Table 1, followed by mixing and dispersing in a 3-roll kneader, thereby preparing a composition for solar cell electrodes. In Table 1, the amount of each component is expressed in percent by weight (wt %).

TABLE 1

|     |      | Example 1 | Example 2 | Example 3 | Example 4 | Example 5 | Comparative Example 1 | Comparative Example 2 |
|-----|------|-----------|-----------|-----------|-----------|-----------|----------------------|----------------------|
| (A) |      | 0.5       | 0.5       | 0.5       | 0.5       | 0.5       | 0.5                  | 0.5                  |
| (B) |      | 2.9       | 2.9       | 2.9       | 2.9       | 2.9       | 2.9                  | 2.9                  |
| (C) | (C1) | 90        | —         | —         | 80        | 80        | —                    | —                    |
|     | (C2) | —         | 90        | —         | —         | —         | —                    | —                    |
|     | (C3) | —         | —         | 90        | —         | —         | —                    | —                    |
| (D) | (D1) | —         | —         | —         | 10        | —         | 90                   | —                    |
|     | (D2) | —         | —         | —         | —         | 10        | —                    | 90                   |
| (E) |      | 5         | 5         | 5         | 5         | 5         | 5                    | 5                    |
| (F) |      | 1.2       | 1.2       | 1.2       | 1.2       | 1.2       | 1.2                  | 1.2                  |
| (G) |      | 0.4       | 0.4       | 0.4       | 0.4       | 0.4       | 0.4                  | 0.4                  |

Fabrication of Solar Cell

An aluminum paste was printed on a back surface of wafers (a monocrystalline wafer prepared by texturing a front surface of a p-type wafer doped with boron, forming an n⁺ layer of POCl₃ on the textured surface, and forming an anti-reflection film of silicon nitride (SiN$_x$:H) on the n' layer), followed by drying in an IR drying furnace at 300° C. for 1 minute. Then, each of the compositions for solar cell electrodes prepared in the Examples and Comparative Examples was deposited over a front surface of the wafers by screen printing in a predetermined pattern. A cell formed according to this procedure was baked in a belt-type baking furnace at a peak temperature of 780° C. for 60 seconds, thereby fabricating a solar cell.

The solar cell was evaluated as to open-circuit voltage (Voc, mV), series resistance (Rs, mΩ), and conversion efficiency (Eff., %) using a solar cell efficiency tester CT-801 (Pasan Co., Ltd.). Results are shown in Table 2.

From the results shown in Table 2, it may be seen that the solar cell electrodes fabricated using the composition for solar cell electrodes according to Examples 1 to 5, including the first silver powder, exhibited improved sinterability and reduced series resistance, thereby improving solar cell conversion efficiency. Conversely, the solar cell electrodes fabricated using the compositions for solar cell electrodes of Comparative Examples 1 and 2, free of the first silver powder, exhibited increased series resistance, causing deterioration in solar cell conversion efficiency.

By way of summation and review, silver (Ag) paste may be used for formation of a front electrode. Such a front electrode may be configured to minimize damage to the contact area between a wafer and the front electrode while maximizing incident light absorption. This relates to how effectively an anti-reflection film of the wafer may be etched and connected to a silver electrode.

One or more embodiments may provide a composition for solar cell electrodes, which may provide low series resistance and good conversion efficiency by including a conductive powder having good sinterability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for solar cell electrodes, the composition comprising:
    a conductive powder;
    a glass frit; and

TABLE 2

|         | Example 1 | Example 2 | Example 3 | Example 4 | Example 5 | Comparative Example 1 | Comparative Example 2 |
|---------|-----------|-----------|-----------|-----------|-----------|----------------------|----------------------|
| Voc (mV) | 665.2    | 664.9     | 665.0     | 664.6     | 664.8     | 664.8                | 664.5                |
| Rs (mΩ)  | 2.28     | 2.25      | 2.31      | 2.44      | 2.43      | 2.67                 | 2.74                 |
| Eff (%)  | 21.78    | 21.75     | 21.76     | 21.73     | 21.71     | 21.62                | 21.59                | an organic vehicle, wherein the conductive powder includes a first silver powder having a cross-sectional particle porosity of 0.1% to 4%;

wherein the conductive powder further includes a second silver powder that is different from the first silver powder; and wherein: the first silver powder is present in an amount of about 30 wt % to about 95 wt %, and the second silver powder is present in an amount of about 5 wt % to about 70 wt %, all wt % being based on a total weight of the conductive powder.

2. The composition as claimed in claim 1, wherein the first silver powder has an average particle diameter of about 0.5 μm to about 3.5 μm.

3. The composition as claimed in claim 1, wherein the first silver powder has an average pore size of about 10 nm to about 300 nm.

4. The composition as claimed in claim 1, wherein the composition includes:
about 60 wt % to about 95 wt % of the conductive powder;
about 0.1 wt % to about 20 wt % of the glass frit; and
about 1 wt % to about 30 wt % of the organic vehicle, all wt % being based on a total weight of the composition.

5. A solar cell electrode formed from the composition for solar cell electrodes as claimed in claim 1.

6. The solar cell electrode as claimed in claim 5, wherein the first silver powder has an average particle diameter of about 0.5 μm to about 3.5 μm.

7. The solar cell electrode as claimed in claim 5, wherein the first silver powder has an average pore size of about 10 nm to about 300 nm.

8. The solar cell electrode as claimed in claim 5, wherein the composition includes:
about 60 wt % to about 95 wt % of the conductive powder;
about 0.1 wt % to about 20 wt % of the glass frit; and
about 1 wt % to about 30 wt % of the organic vehicle, all wt % being based on a total weight of the composition.

9. The solar cell electrode as claimed in claim 5, wherein the solar cell electrode is prepared by:
applying the composition for solar cell electrodes onto a substrate; and
baking the substrate having the composition thereon.

10. A method of manufacturing a solar cell, the method comprising:
applying the composition for solar cell electrodes as claimed in claim 1 onto a substrate; and
baking the substrate having the composition thereon.

11. A composition for solar cell electrodes, the composition comprising: a conductive powder;
a glass frit; and
an organic vehicle,
wherein the conductive powder includes:
a first silver powder having a cross-sectional particle porosity of about 0.1% to about 6%, and
a second silver powder different from the first silver powder and having a cross-sectional particle porosity of less than 0.1%.

12. The composition as claimed in claim 11, wherein the first silver powder has a cross-sectional particle porosity of 0.1% to less than 5%.

13. The composition as claimed in claim 11, wherein the first silver powder has a cross-sectional particle porosity of 0.1% to 4%.

* * * * *